United States Patent
Kwak et al.

(10) Patent No.: US 7,009,197 B2
(45) Date of Patent: Mar. 7, 2006

(54) APPARATUS FOR MEASURING GAP BETWEEN MASK AND SUBSTRATE USING LASER DISPLACEMENT SENSOR, AND METHOD THEREOF

(75) Inventors: Changsoo Kwak, Daejeon (KR); Eul Gyoon Lim, Seoul (KR); Dae Yong Kim, Daejeon (KR)

(73) Assignee: Electronics and Telecommunications Research Institute, (KR)

( * ) Notice: Subject to any disclaimer, the term of this patent is extended or adjusted under 35 U.S.C. 154(b) by 127 days.

(21) Appl. No.: 10/723,618

(22) Filed: Nov. 25, 2003

(65) Prior Publication Data

US 2004/0195530 A1    Oct. 7, 2004

(30) Foreign Application Priority Data

Apr. 4, 2003  (KR) ............... 10-2003-0021406

(51) Int. Cl.
*G01V 8/00* (2006.01)
*G01N 21/86* (2006.01)

(52) U.S. Cl. ................ 250/559.29; 356/614
(58) Field of Classification Search .......... 250/548, 250/559.29, 559.3, 559.38, 234; 356/601, 356/614, 615, 620, 622, 237.2, 237.5, 399–401
See application file for complete search history.

(56) References Cited

U.S. PATENT DOCUMENTS 5,239,183 A    8/1993  Kouno et al.
6,649,923 B1 *  11/2003  Matsumoto ............ 250/548

FOREIGN PATENT DOCUMENTS

KR    P2000-0055698    9/2000
KR    P2001-0076131    8/2001

* cited by examiner

*Primary Examiner*—Kevin Pyo
(74) *Attorney, Agent, or Firm*—Blakely Sokoloff Taylor & Zafman

(57) ABSTRACT

An apparatus for measuring a gap between a mask and a substrate and a method thereof are provided. The apparatus includes a laser displacement sensor, which is placed on a mask and a substrate spaced apart from each other by a predetermined gap, emits laser beams while moving onto the mask and the substrate in a horizontal direction and measures a gap between the mask and the substrate using a variation in distance values measured based on light-receiving positions of the laser beams that are reflected from the mask and the substrate and return to their original positions, respectively.

6 Claims, 5 Drawing Sheets

APPARATUS FOR MEASURING GAP BETWEEN MASK AND SUBSTRATE USING LASER DISPLACEMENT SENSOR, AND METHOD THEREOF

BACKGROUND OF THE INVENTION

This application claims the priority of Korean Patent Application No. 2003-21406, filed on Apr. 4, 2003, in the Korean Intellectual Property Office, the disclosure of which is incorporated herein in its entirety by reference.

1. Field of the Invention

The present invention relates to a gap measurement apparatus and a method thereof used in an exposure process performed when a semiconductor device and a display are manufactured, and more particularly, to an apparatus for measuring a gap between a mask and a substrate and a method thereof.

2. Description of the Related Art

In general, a semiconductor device and a display are used as essential elements of supporting information electronic technologies. In an exposure process used to manufacture such semiconductor device and display, a gap between a mask and a substrate (semiconductor substrate or glass substrate) serves as an important factor of determining an exposure quality. Thus, it is essential in the exposure process to measure the gap between the mask and the substrate exactly and adjust the gap. An operation of measuring a gap between two substrates and adjusting the gap is widely used in a variety of fields, except for the exposure process.

FIG. 1 illustrates a conventional gap measurement apparatus using a charge coupled device (CCD).

Specifically, in the conventional gap measurement apparatus, when a laser oscillator 51 emits laser beams, the laser beam passes a first lens 53 and reaches a mask M and a substrate S at a predetermined angle using a first reflector 55. A part of the laser beam is reflected from a lower surface of the mask M, and other part thereof is reflected from an upper surface of the substrate S and passes a second lens 63 using a second reflector 61 via different paths. A two-dimensional CCD 65 recognizes light-receiving positions of two laser beams transmitted via the different paths and transmits coordinate values thereof to a signal processing unit 67. The signal processing unit 67 calculates a gap between the mask M and the substrate S using a difference between the coordinate values and transmits a gap value to a controller 69. An image obtained by the two-dimensional CCD 65 is transmitted to an image processing unit 70 and displayed visually on a monitor.

However, the conventional gap measurement apparatus of FIG. 1 performs gap measurement by recognizing positions of reflected laser beams using the two-dimensional CCD 65. However, the price of the conventional gap measurement apparatus of FIG. 1 is high, and the gap measurement apparatus cannot simply measure a gap between a mask and a substrate at a desired position of a large area.

SUMMARY OF THE INVENTION

The present invention provides an apparatus for measuring a gap between a mask and a substrate simply and at a low price at a desired position using a laser displacement sensor.

The present invention also provides a method of measuring a gap between a mask and a substrate simply and at a low price at a desired position by moving to the mask or the substrate using a laser displacement sensor.

According to an aspect of the present invention, an apparatus for measuring a gap between a mask and a substrate includes a laser displacement sensor, which is placed on a mask and a substrate spaced apart from each other by a predetermined gap, emits laser beams while moving over the mask and the substrate in a horizontal direction and measures a gap between the mask and the substrate using a variation in distance values measured successively based on light-receiving positions of the laser beams that are reflected form the mask and the substrate, respectively.

The apparatus includes a Z-direction transferring unit, which adjusts a vertical distance (Z-direction distance) between the laser displacement, the mask, and the substrate, an X-direction transferring unit, which enables the laser displacement sensor to move in a widthwise direction (X direction) on the plane parallel to the mask or the substrate; and a Y-direction transferring unit, which enables the laser displacement sensor to move in a lengthwise direction (Y direction) on the plane parallel to the mask or the substrate.

It is preferable that an image obtaining unit may be connected to the laser displacement sensor so that positions on the mask in which the laser displacement sensor measures the gap between the mask and the substrate are virtually checked. Also, a display, which indicates an image obtained by the image obtaining unit, may be connected to the image obtaining portion.

Preferably, the apparatus for measuring a gap between a mask and a substrate further comprises a control unit, which calculates the gap between the mask and the substrate by storing a value output from the laser displacement sensor.

Preferably, a plurality of laser displacement sensors may be provided so that a gap between the mask and the substrate is simultaneously measured at several positions.

According to another aspect of the present invention, a method of measuring a gap between a mask and a substrate includes moving a laser displacement sensor to a predetermined position on a mask and a substrate spaced apart from each other by a predetermined gap, and adjusting a vertical distance between the mask or the substrate and the laser displacement sensor so as to match an operating distance of the laser displacement sensor. The method includes emitting laser beams on an upper surface of the substrate by passing the mask, and measuring a first distance value based on light-receiving positions of the laser beams that are reflected from the upper surface of the substrate and return to their original positions, using the laser displacement sensor. The method further includes emitting laser beams on a mask pattern placed on a lower surface of the mask and measuring a second distance value based on light-receiving positions of the laser beams that are reflected from the mask pattern and return to their original positions, using the laser displacement sensor; and determining the gap between the mask and the substrate using a difference between the first distance value and the second distance value.

As described above, according to the present invention, the gap between the mask and the substrate can be simply measured at the desired position using the laser displacement sensor.

BRIEF DESCRIPTION OF THE DRAWINGS

The above and other aspects and advantages of the present invention will become more apparent by describing in detail a preferred embodiment thereof with reference to the attached drawings in which.

DETAILED DESCRIPTION OF THE INVENTION

Figure 1:
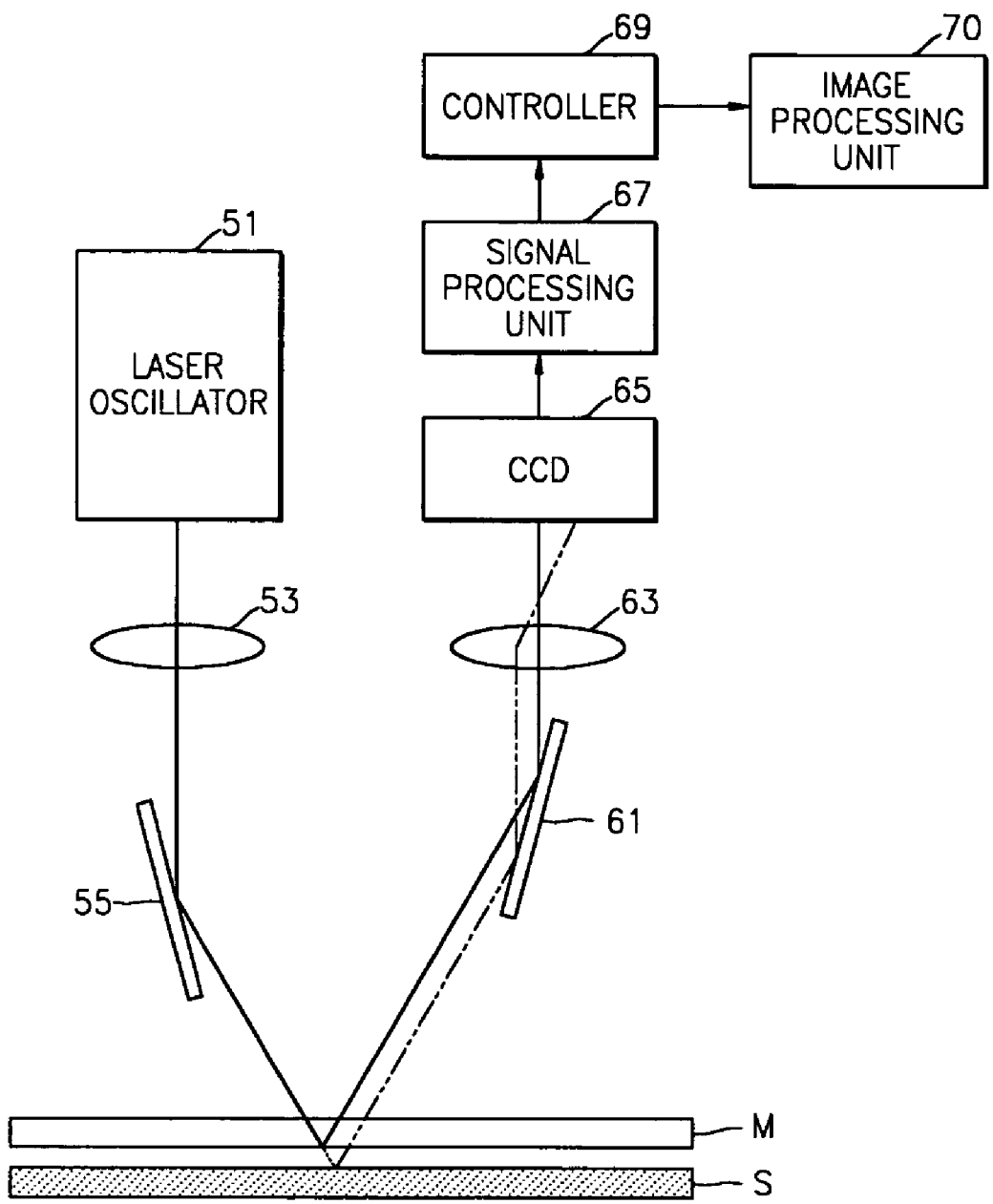
FIG. 1 illustrates a conventional gap measurement apparatus using a charge coupled device (CCD)

Hereinafter, preferred embodiments of the present invention will be described in detail with reference to the accompanying drawings. This invention may, however, be embodied in many different forms and should not be construed as being limited to the embodiments set forth herein. Rather, theses embodiments are provided so that this disclosure will be thorough and complete, and will fully convey the scope of the invention to those skilled in the art. In FIGS. 2 through 7, like reference numerals refer to like elements.

Figure 2:
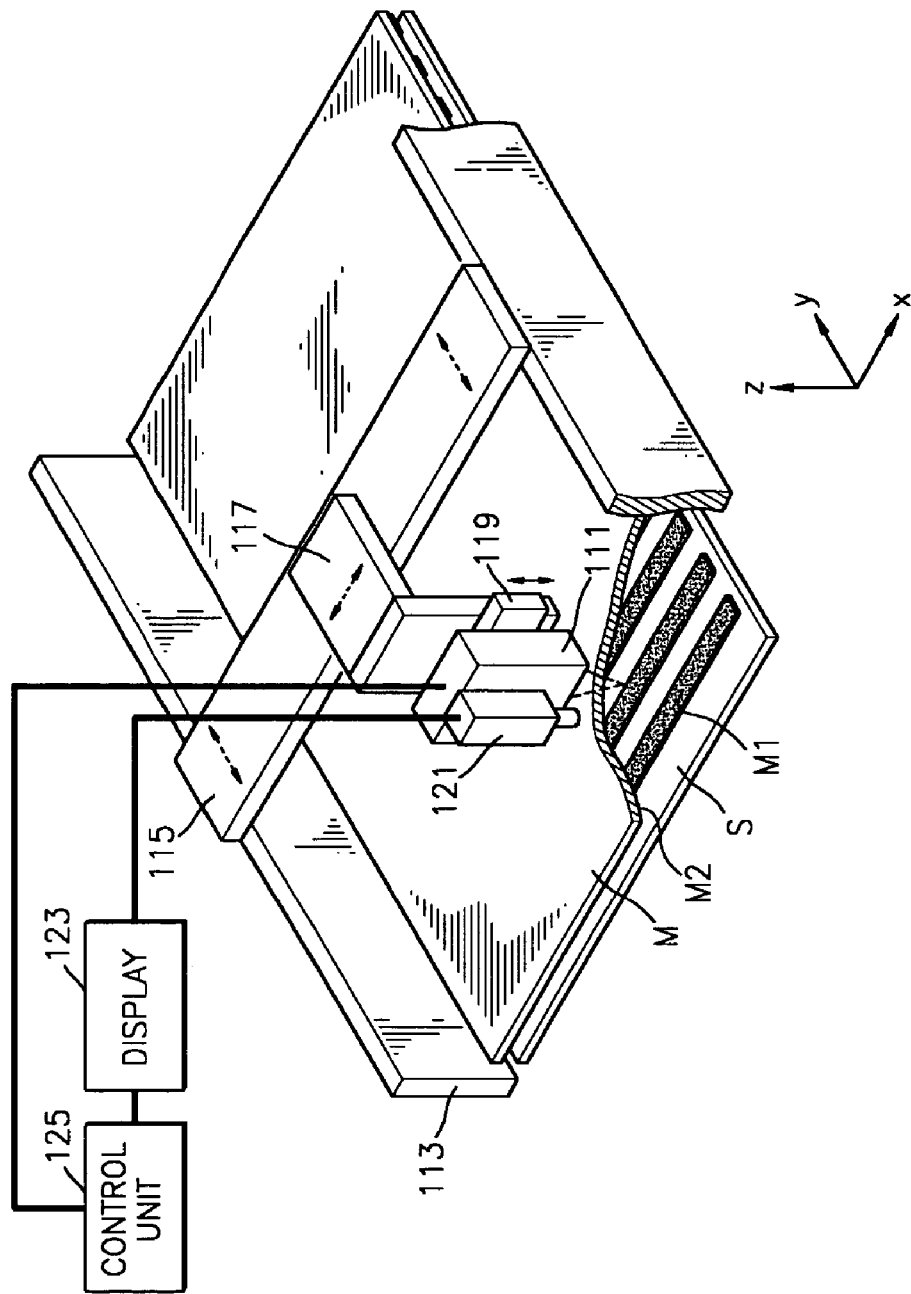
FIG. 2 illustrates a gap measurement apparatus according to the present invention.

FIG. 2 illustrates a gap measurement apparatus according to the present invention.

Specifically, in the gap measurement apparatus according to the present invention, a laser displacement sensor 111 is installed on a substrate S and a mask M, which are spaced apart from each other by a predetermined gap. The substrate S may be a display substrate, and the mask M may be a glass substrate. The mask M includes a region M1 in which a mask pattern into which light is not transmitted is formed, and a region M2 in which the mask pattern is not formed.

The laser displacement sensor 111 emits laser beams and measures a gap between the mask M and the substrate S using the variation in light-receiving positions of the laser beams that are reflected from the mask M or the substrate S and return to their original positions, respectively. The laser displacement sensor 111 includes a laser beam source portion for emitting laser beams on an object to be measured and a laser beam position detection portion for detecting positions of the laser beams by receiving laser beams that are reflected from the object to be measured and return to their original positions. The structure of the laser displacement sensor 111 and a is method of measuring a gap between a mask and a substrate using the laser displacement sensor 111 will be described later.

A plane parallel to the mask M or the substrate S is an X-Y plane, and a direction perpendicular to the plane is Z direction. A Y-direction moving guide 113 is installed to be placed on both sides in X direction of the mask M or the substrate S and to guide to move the laser displacement sensor 111 in Y direction. A Y-direction transferring unit 115 is installed to be supported by the Y-direction moving guide 113, to move in Y direction along the Y-direction moving guide 113, and to guide to move in X direction. An X-direction transferring unit 117 is installed to be transferred by the Y-direction transferring unit 115 in X direction and to guide to transfer in Z direction. A Z-direction transferring unit 119 is installed to be supported by the X-direction transferring unit 117, to be transferred in Z direction, and to mount the laser displacement sensor 111.

The Y-direction transferring unit 115 enables the laser displacement sensor 111 to move in a lengthwise direction (Y direction) on the plane parallel to the mask M or the substrate S. The X-direction transferring unit 117 enables the laser displacement sensor 111 to move in a widthwise direction (X direction) on the plane parallel to the mask M or the substrate S. In other words, the Y-direction transferring unit 115 and the X-direction transferring unit 117 move the laser displacement sensor 111 to a position where a gap is to be measured. As such, by using the Y-direction transferring unit 115 and the X-direction transferring unit 117, the laser displacement sensor 111 moves between the region M1 in which the mask pattern on the mask M is formed and the region M2 in which the mask pattern is not formed.

The Z-direction transferring unit 119 adjusts a distance between the laser displacement sensor 111, the mask M, and the substrate S. As such, the Z-direction transferring unit 119 adjusts positions so that a lower surface in which the mask pattern is formed and an upper surface of the substrate S are within the range of an operating distance of the laser displacement sensor 111.

In addition, an image obtaining unit 121 is connected to the laser displacement sensor 111 so that positions on the mask M in which the laser displacement sensor 111 measures a gap between the mask M and the substrate S are virtually checked. A display 123, which indicates an image obtained by the image obtaining unit 121, is connected to the image obtaining unit 121. A control unit 125 which calculates the gap between the mask M and the substrate S by storing a value output from the laser displacement sensor 111 as a measurement value, is connected to the display 123.

Figure 3:
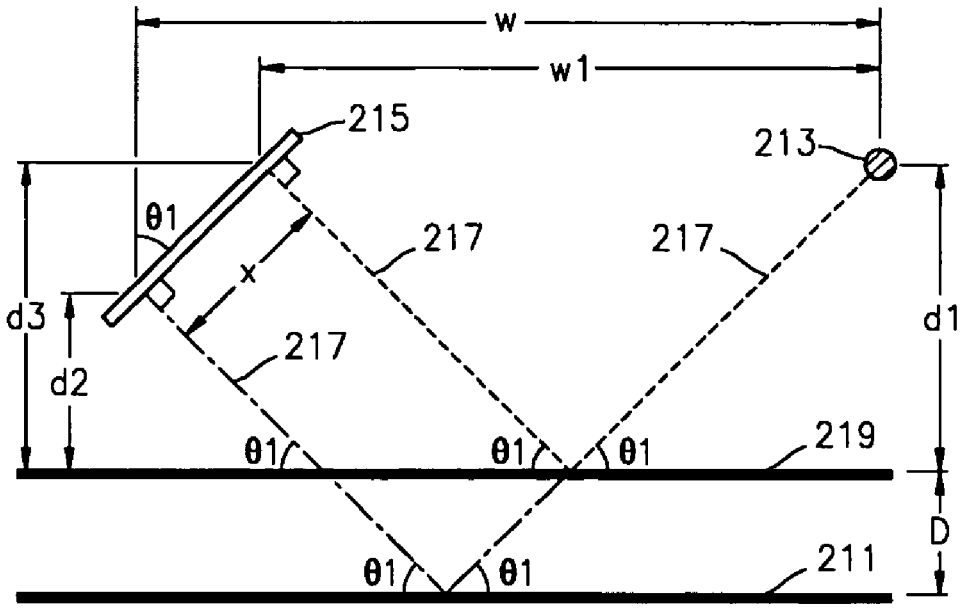
FIG. 3 illustrates a structure of a laser displacement sensor used in the gap measurement apparatus shown in FIG. 2 and the basic operation of the laser displacement sensor.

FIG. 3 illustrates a structure of a laser displacement sensor used in the gap measurement apparatus shown in FIG. 2 and the basic operation of the laser displacement sensor.

Specifically, the laser displacement sensor (111 of FIG. 2) used in the present invention includes a laser beam source portion 213 for emitting a laser beam 217 on an object 211 to be measured and a laser beam position detection portion 215 for detecting positions of the laser beams by receiving the laser beams that are reflected from the object to be measured and return to their original positions. In view of the operation of the laser displacement sensor, the laser beam position detection portion 215 senses light-receiving positions of the laser beam 217 emitted from the laser beam source portion 213 and reflected from a reference surface 219 at a predetermined angle, and defines the light-receiving positions as a reference distance of displacement measurement. Then, if the object 211 to be measured moves and a measurement distance is varied, the light-receiving positions of the laser beam position detection portion 215 are varied, and the displacement (distance) of the object 211 to be measured is calculated using a difference in the light-receiving positions.

A procedure of calculating displacement measurement of the laser displacement sensor shown in FIG. 3 is as follows. In FIG. 3, Equations 1 through 4 are established as follows.

$$W = d_1 \cdot \cot \theta_1 + 2 \cdot D \cdot \cot \theta_1 + d_2 \cdot \cot \theta_1 \quad (1)$$

$$W_1 = d_1 \cdot \cot \theta_1 + d_3 \cdot \cot \theta_1 \quad (2)$$

$$d_3 - d_2 = X \cdot \cos \theta_1 \quad (3)$$

$$W - W_1 = X \cdot \sin \theta_1 \quad (4)$$

Equations 1, 2, 3, and 4 are solved with respect to a displacement value D, and a solution result is expressed as Equation 5.

$$D = \frac{X}{2\cos\theta_1} \quad (5)$$

Hereinafter, a gap measurement method using the gap measurement apparatus of FIG. 2 will be described. In a prior-art gap measurement apparatus, light-receiving positions of a laser beam reflected from a lower surface of the mask M and a laser beam reflected from an upper surface of the substrate S are detected, and a gap between the mask M and the substrate S is calculated using a difference in the light-receiving positions. However, the laser displacement sensor employed in the present invention measures a distance from the laser displacement sensor to one object to be measured at a time and calculates a gap between a mask and a substrate using a difference in measurement distances of a plurality of positions.

Figure 4:
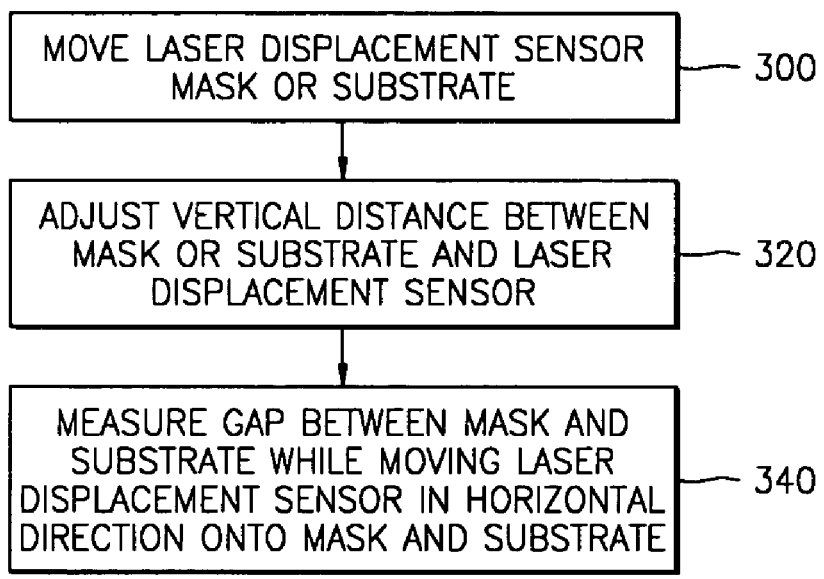
FIG. 4 is a flowchart illustrating a gap measurement method using the gap measurement apparatus of FIG. 2 according to an embodiment of the present invention.

FIG. 4 is a flowchart illustrating a gap measurement method using the gap measurement apparatus of FIG. 2 according to an embodiment of the present invention.

Specifically, a laser displacement sensor is moved to a predetermined position on a mask and a substrate spaced apart from each other by a predetermined gap using an X-direction transferring unit and a Y-direction transferring unit of the gap measurement apparatus of FIG. 2 (step 300).

Subsequently, a vertical distance between the mask or the substrate spaced apart from each other by a predetermined gap and the laser displacement sensor is adjusted using a Z-direction transferring unit of the gap measurement apparatus of FIG. 2 so as to match an operating distance of the laser displacement sensor (step 320).

Next, laser beams are emitted while the laser displacement sensor is moved in a horizontal direction onto the mask and the substrate, and a gap between the mask and the substrate is measured using the variation in distance values measured based on light-receiving positions of laser beams that are reflected from the mask and the substrate and return to their original positions (step 340).

Figure 5:
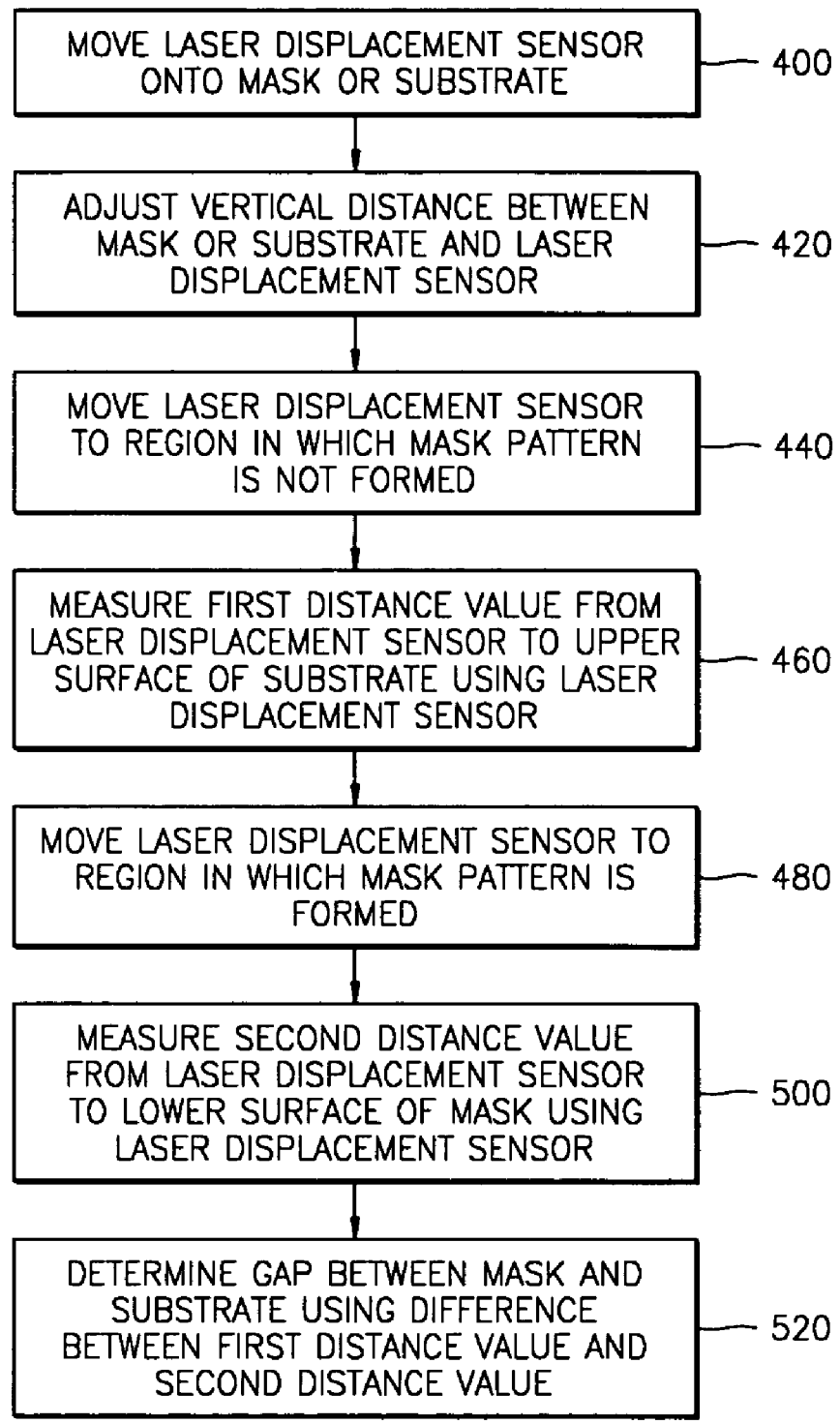
FIG. 5 is a flowchart illustrating a gap measurement method using the gap measurement apparatus of FIG. 2 according to another embodiment of the present invention.
Figure 6:
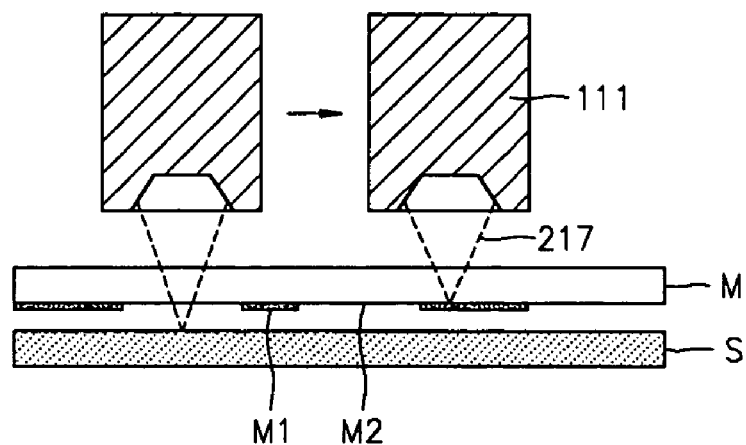
FIG. 6 illustrates the moving relation of the laser displacement sensor for explaining the gap measurement method of FIG. 5.

FIG. 5 is a flowchart illustrating a gap measurement method using the gap measurement apparatus of FIG. 2 according to another embodiment of the present invention, and FIG. 6 illustrates the moving relation of the laser displacement sensor for explaining the gap measurement method of FIG. 5.

Specifically, a laser displacement sensor is moved to a predetermined position on a mask and a substrate spaced apart from each other by a predetermined gap using an X-direction transferring unit and a Y-direction transferring unit of the gap measurement apparatus of FIG. 2 (step 400).

Subsequently, a vertical distance between the mask or the substrate spaced apart from each other by a predetermined gap and the laser displacement sensor is adjusted using a Z-direction transferring unit of the gap measurement apparatus of FIG. 2 so as to match an operating distance of the laser displacement sensor (step 420).

Next, as shown in FIG. 6, the laser displacement sensor is moved onto the substrate of a region M2 in which a mask pattern of the mask is not formed (step 440). Subsequently, laser beams are emitted on an upper surface of the substrate by passing the mask, and a first distance value is measured based on light-receiving positions of the laser beams that are reflected from the upper surface of the substrate and return to their original positions, using the laser displacement sensor. In other words, if a distance value is measured by emitting laser beams on the region M2 in which the mask pattern is not formed, the laser displacement sensor measures a distance from the laser displacement sensor to the upper surface of the substrate S (step 460).

Next, as shown in FIG. 6, the laser displacement sensor is moved onto a region M1 in which the mask pattern of the mask is formed (step 480). Subsequently, laser beams are emitted on the mask pattern placed on a lower surface of the mask, and a second distance value is measured based on light-receiving positions of the laser beams that are reflected from the mask pattern and return to their original positions, using the laser displacement sensor. In other words, if a distance value is measured by emitting laser beams on the region M1 in which the mask pattern is formed, the laser displacement sensor measures a distance from the laser displacement sensor to the lower surface of the mask M (step 500).

Next, a gap between the mask and the substrate is determined using a difference between the first distance value and the second distance value. In other words, a difference in distance between the lower surface of the mask M and the upper surface of the substrate S is the gap between the mask M and the substrate S (step 520).

In FIGS. 5 and 6, the laser displacement sensor measures a distance previously in the region M2 in which the mask pattern is not formed and a distance in the region M1 in which the mask pattern is formed, such that a difference in the distances is measured as a gap between the mask and the substrate. Conversely, the laser displacement sensor may measure a distance previously in the region M1 in which the mask pattern is formed and a distance in the region M2 in which the mask pattern is not formed, such that a difference in the distances is measured as a gap between the mask and the substrate.

Figure 7:
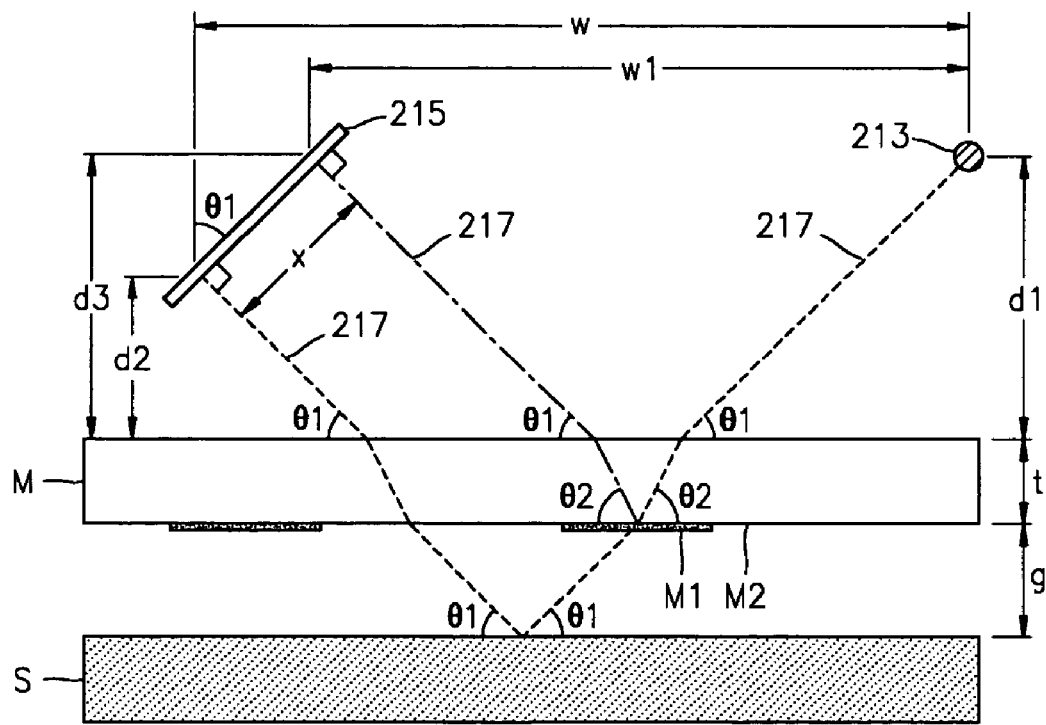
FIG. 7 illustrates the operation of a laser displacement sensor in a case where refraction occurs in a mask when the gap measurement apparatus of FIG. 2 is used.

FIG. 7 illustrates the operation of a laser displacement sensor in a case where refraction occurs in a mask when the gap measurement apparatus of FIG. 2 is used.

Specifically, since a mask M is made of soda lime glass or quartz having a predetermined refraction index, refraction occurs when a laser beam passes the mask M. Thus, whether a distance measurement value can be used without changes should be checked. FIG. 7 illustrates a case where the laser beam is reflected from a region M1 in which a mask pattern is formed and transmitted into a laser beam position detection portion, and a case where assuming that there is no mask pattern, the laser beam is reflected from the substrate S and transmitted into the laser beam position detection portion. In this case, the Equations 6 through 9 are established as below.

$$W = d_1 \cdot \cot\theta_1 + 2 \cdot t \cdot \cot\theta_2 + 2 \cdot g \cdot \cot\theta_1 + d_2 \cdot \cot\theta_1 \quad (6)$$

$$W_1 = d_1 \cdot \cot\theta_1 + 2 \cdot t \cdot \cot\theta_2 + d_3 \cdot \cot\theta_1 \quad (7)$$

$$d_3 - d_2 = X \cdot \cos\theta_1 \quad (8)$$

$$W - W_1 = X \cdot \sin\theta_1 \quad (9)$$

Equations 6 through 9 are solved with respect to a gap g between the mask M and the substrate S, and a solution result is expressed as Equation 10.

$$W - W_1 = X \cdot \sin\theta_1 = \{2g + (d_2 - d_3)\}\cot\theta_1 \quad (10)$$

$$= 2g \cdot \frac{\cos\theta_1}{\sin\theta_1} - X \cdot \cos\theta_1 \cdot \frac{\cos\theta_1}{\sin\theta_1}$$

Subsequently, Equations 9 and 10 are solved with each other, and a solution result is expressed as Equation 11.

$$X \cdot \sin^2 \theta_1 = 2g \cos \theta_1 - X \cdot \cos^2 \theta_1 \quad (11)$$

Consequently, a solution result of Equation 11 is expressed as Equation 12.

$$g = \frac{X}{2\cos\theta_1} \quad (12)$$

Equation 12 is the same Equation having the above-described value calculated when one object to be measured is moved by displacement D. In other words, when one laser displacement sensor measures distances from the laser displacement sensor to a lower surface of the mask M and an upper surface of the substrate S, respectively, a difference in measurement distance values is a gap between the mask M and the substrate S.

As described above, in the apparatus for measuring a gap between a mask and a substrate and the method thereof according to the present invention, the gap between the mask and the substrate can be simply measured at a desired position using a laser displacement sensor, and in particular, the gap can be simply measured even at a desired position of a large area.

What is claimed is:

1. An apparatus for measuring a gap between a mask and a substrate, the apparatus comprising:
   a laser displacement sensor, which is placed on a mask and a substrate spaced apart from each other by a predetermined gap, emits laser beams while moving over the mask and the substrate in a horizontal direction and measures a gap between the mask and the substrate using a variation in distance values measured successively based on light-receiving positions of the laser beams that are reflected from the mask and the substrate, respectively;
   a Z-direction transferring unit, which adjusts a vertical distance (Z-direction distance) between the laser displacement, the mask, and the substrate;
   an X-direction transferring unit, which enables the laser displacement sensor to move in a widthwise direction (X direction) in the plane parallel to the mask or the substrate; and
   a Y-direction transferring unit, which enables the laser displacement sensor to move in a lengthwise direction (Y direction) in the plane parallel to the mask or the substrate.

2. The apparatus of claim 1, wherein an image obtaining unit is connected to the laser displacement sensor so that positions on the mask in which the laser displacement sensor measures the gap between the mask and the substrate are visually checked.

3. The apparatus of claim 2, wherein a display, which indicates an image obtained by the image obtaining unit, is connected to the image obtaining portion.

4. The apparatus of claim 1, further comprising a control unit, which calculates the gap between the mask and the substrate by storing a value output from the laser displacement sensor.

5. The apparatus of claim 1, wherein a plurality of laser displacement sensors are provided so that a gap between the mask and the substrate is simultaneously measured at several positions.

6. A method of measuring a gap between a mask and a substrate, the method comprising:
   moving a laser displacement sensor to a predetermined position on a mask and a substrate spaced apart from each other by a predetermined gap;
   adjusting a vertical distance between the mask or the substrate and the laser displacement sensor so as to match an operating distance of the laser displacement sensor;
   emitting laser beams on an upper surface of the substrate by passing the mask, and measuring a first distance value based on light-receiving positions of the laser beams that are reflected from the upper surface of the substrate, using the laser displacement sensor;
   emitting laser beams on a mask pattern placed on a lower surface of the mask and measuring a second distance value based on light-receiving positions of the laser beams that are reflected from the mask pattern, using the laser displacement sensor; and
   determining the gap between the mask and the substrate using a difference between the first distance value and the second distance value.

* * * * *